(12) United States Patent
Handy et al.

(10) Patent No.: US 10,560,087 B2
(45) Date of Patent: Feb. 11, 2020

(54) PASSIVE LEAKAGE MANAGEMENT CIRCUIT FOR A SWITCH LEAKAGE CURRENT

(71) Applicant: GE Aviation Systems Limited, Cheltenham, Gloucestershire (GB)

(72) Inventors: Peter James Handy, Cheltenham (GB); Nicholas George Tembe, Cheltenham (GB)

(73) Assignee: GE Aviation Systems Limited, Cheltenham (GB)

( * ) Notice: Subject to any disclaimer, the term of this patent is extended or adjusted under 35 U.S.C. 154(b) by 0 days.

(21) Appl. No.: 15/577,258

(22) PCT Filed: Jun. 29, 2015

(86) PCT No.: PCT/EP2015/064730
§ 371 (c)(1),
(2) Date: Nov. 27, 2017

(87) PCT Pub. No.: WO2017/000981
PCT Pub. Date: Jan. 5, 2017

(65) Prior Publication Data
US 2018/0145677 A1 May 24, 2018

(51) Int. Cl.
*H03K 17/16* (2006.01)
*H02M 7/06* (2006.01)
*H02J 4/00* (2006.01)

(52) U.S. Cl.
CPC .............. *H03K 17/16* (2013.01); *H02M 7/06* (2013.01); *H02J 4/00* (2013.01)

(58) Field of Classification Search
CPC ............. H03K 17/16; H02M 7/06; H02J 4/00

USPC .......................................................... 327/379
See application file for complete search history.

(56) References Cited

U.S. PATENT DOCUMENTS

| | | | |
|---|---|---|---|
| 2012/0126714 A1* | 5/2012 | Deppe ................ | H05B 33/0815 315/192 |
| 2012/0139431 A1* | 6/2012 | Thompson ......... | H05B 33/0815 315/200 R |
| 2012/0274216 A1* | 11/2012 | Datta ................. | H05B 33/0815 315/127 |
| 2015/0009593 A1* | 1/2015 | Guenot .................... | H02H 5/12 361/42 |

(Continued)

FOREIGN PATENT DOCUMENTS

| CN | 103748752 A1 | 4/2014 |
|---|---|---|
| CN | 104283190 A | 1/2015 |
| WO | 2014/013381 A1 | 1/2014 |

OTHER PUBLICATIONS

International Search Report and Written Opinion issued in connection with corresponding PCT Application No. PCT/EP2015/064730 dated Mar. 15, 2016.

(Continued)

*Primary Examiner* — Ryan Jager
(74) *Attorney, Agent, or Firm* — McGarry Bair PC

(57) ABSTRACT

A passive leakage management circuit for a switch leakage current including a switch having operable in a first operating mode, wherein the switch output supplies an output current having a first predetermined voltage, and a second operating mode, wherein the switch output supplies a leakage current having a second voltage, a first current path, and a leakage current path.

22 Claims, 4 Drawing Sheets

(56) References Cited

U.S. PATENT DOCUMENTS

2015/0181682 A1\* 6/2015 Shet .................. H05B 33/0806
315/127

OTHER PUBLICATIONS

International Preliminary Report on Patentability issued in connection with corresponding PCT Application No. PCT/EP2015/064730 dated Jan. 11, 2018.
Chinese Office Action issued in related Chinese patent application No. 201580081381.3, dated Jul. 26, 2019.

\* cited by examiner

PASSIVE LEAKAGE MANAGEMENT CIRCUIT FOR A SWITCH LEAKAGE CURRENT

BACKGROUND OF THE INVENTION

Electrical circuits can be configured having a switch for controlling an electrical operation, such as enabling or disabling an electrical load. For example, the switch can be controllable to toggle between a first mode of operation, wherein the switch is "closed" intending current to be transmitted from a switch input to a switch output, and a second mode of operation, wherein the switch is "open" intending current to be prevented from transmitting between the switch input and switch output.

In some switches current can leak between the switch input and switch output when the switch is open, due to electrical characteristics or physical limitations of the switch. In some environments, it can be desirable to plan for and control the leakage current, which can include a specific leakage current path for transmission of the leakage current.

BRIEF DESCRIPTION OF THE INVENTION

In one embodiment, a passive leakage management circuit for a switch leakage current includes a switch having a switch input electrically coupled with a source of alternating current (AC), and a switch output electrically coupled with an electrical load, and operable in a first operating mode, wherein the switch output supplies an AC output current provided to the switch input and having a first AC voltage, and in a second operating mode, wherein the switch output supplies an AC leakage current from the switch input and having a second AC voltage lower than the first AC voltage, a rectifying module electrically coupled with the switch output and configured to rectify the AC output current to a direct current (DC) output current during the first operating mode and the second operating mode, a first current path configured to receive the DC output current and including a first transistor, wherein the first transistor conducts current along the first current path based on the switch output, and a leakage current path configured to receive the DC output current and including a second transistor, wherein the second transistor conducts current along the leakage current path based on the first transistor conducting current. At least one of the first current path or leakage current path conducts current automatically based on the switch output, independent of the operating mode of the switch.

In another embodiment, a power management circuit includes a switch having an input receiving AC power, an AC output, and a switching component selectively coupling the input with the AC output between an open switching state and a closed switching state, a rectifier configured to rectify the AC switch output to a DC output, and a voltage-controlled current sink configured to receive the DC output, and defining a first current path for dissipating a first amount of power when the switching state is closed and a leakage current path for dissipating a second amount of power when the switching state is open. The voltage-controlled current sink conducts the DC output along at least one of the first current path or the leakage current path automatically regardless of the switching state.

In yet another embodiment, a leakage management circuit includes a rectifier configured to rectify an AC input to a DC output, and a voltage-controlled current sink configured to receive the DC output, and defining a first current path for dissipating a first amount of power when the AC input satisfies a first profile and a leakage current path for dissipating a second amount of power when the AC input satisfies a second profile. The voltage-controlled current sink conducts the DC output along at least one of the first current path or the leakage current path automatically regardless of the AC input.

DETAILED DESCRIPTION

As used herein, a switch is an electrical device that can be controllable to toggle between a first mode of operation, wherein the switch is "closed" intending to transmit current from a switch input to a switch output, and a second mode of operation, wherein the switch is "open" intending to prevent current from transmitting between the switch input and switch output. Embodiments of the invention can be implemented in any electrical circuit environment having a switch, wherein a leakage current exists when the switch is in the open state. A non-limiting example of an electrical circuit environment that can include embodiments of the invention can include an aircraft power system architecture, which enables production of electrical power from at least one spool of a turbine engine, more particularly a gas turbine engine, and delivers the electrical power to a set of electrical loads via at least one solid state switch, such as a solid state power controller (SSPC) switching device.

Additionally, while terms such as "voltage", "current", and "power" can be used herein, it will be evident to one skilled in the art that these terms can be interchangeable when describing aspects of the electrical circuit, or circuit operations.

Figure 1:
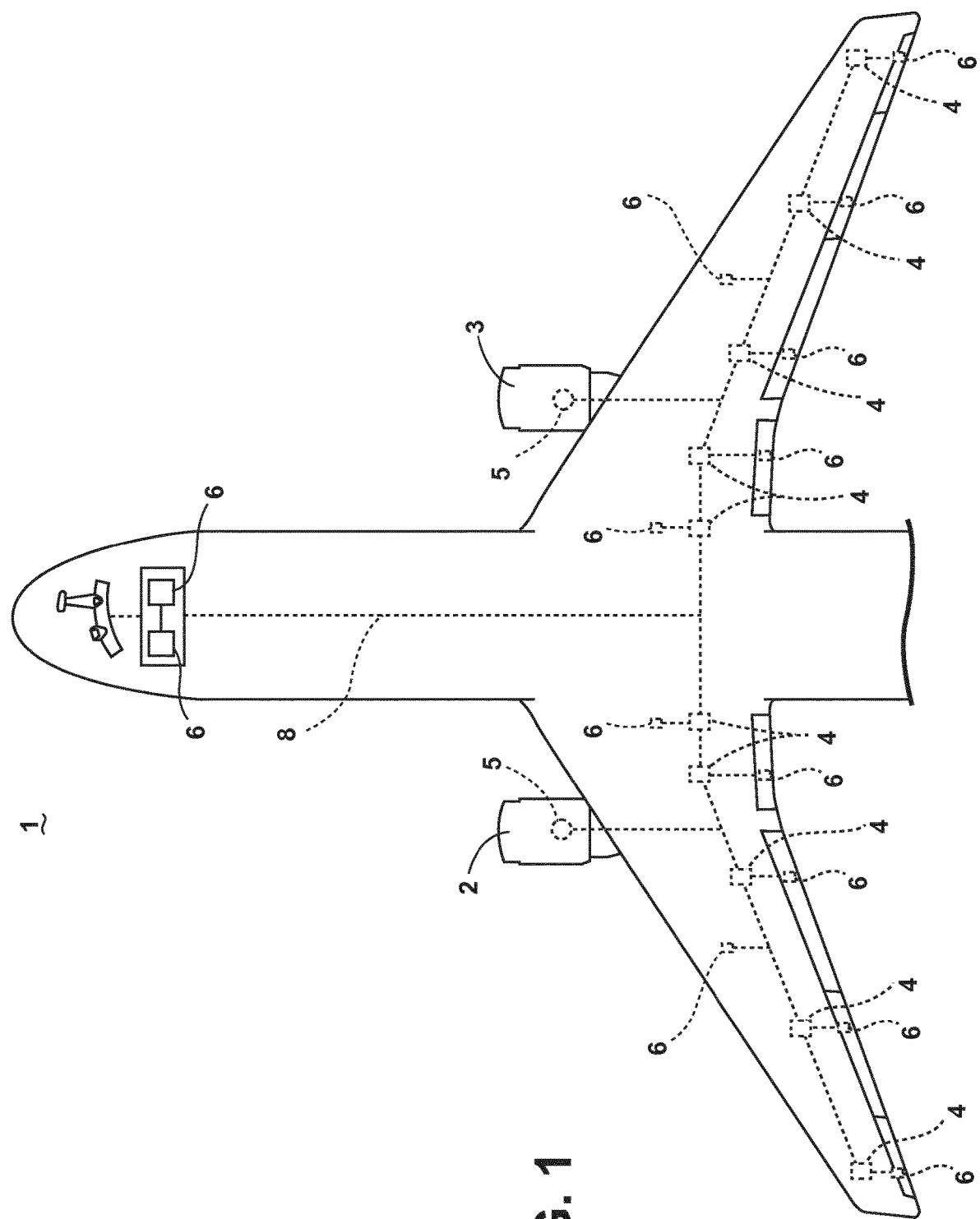
FIG. 1 is a top down schematic view of the aircraft and power distribution system of an aircraft.

As illustrated in FIG. 1, an aircraft 1 is shown having at least one gas turbine engine, shown as a left engine system 2 and a right engine system 3. Alternatively, the power system can have fewer or additional engine systems. The left and right engine systems 2, 3 can be substantially identical, and can further include at least one power source, such as an electric machine or a generator 5. The aircraft is shown further having a set of power-consuming components, or electrical loads 6, such as for instance, an actuator load, flight critical loads, and non-flight critical loads. The electrical loads 6 are electrically coupled with at least one of the generators 5 via a power distribution system including, for instance, power transmission lines 8 or bus bars, and power distribution nodes 4. It will be understood that the illustrated embodiment of the invention of FIG. 1 is only one non-limiting example of a power distribution system, and many other possible embodiments and configurations in addition to that shown are contemplated by the present disclosure. Furthermore, the number of, and placement of, the various components depicted in FIG. 1 are also non-limiting examples of embodiments associated with the disclosure.

In the aircraft 1, the operating left and right engine systems 2, 3 provide mechanical energy which can be extracted, typically via a spool, to provide a driving force for the generator 5. The generator 5, in turn, generates power, such as AC or DC power, and provides the generated power to the transmission lines 8, which delivers the power to the power distribution nodes 4, positioned throughout the aircraft 1. The power distribution nodes 4 receive the AC or DC power via the transmission lines 8, and can provide switching, power conversion, or distribution management functions, as needed, in order to provide the desired electrical power to the electrical loads 6 for load operations.

Example power distribution management functions can include, but are not limited to, selectively enabling, disabling, or switching on or off the delivery of power to particular electrical loads 6, depending on, for example, available power distribution supply, criticality of electrical load 6 functionality, or aircraft mode of operation, such as take-off, cruise, or ground operations. Additional management functions can be included. Furthermore, additional power sources for providing power to the electrical loads 6, such as emergency power sources, ram air turbine systems, starter/generators, or batteries, can be included, and can substitute for the power source. It will be understood that while one embodiment of the invention is shown in an aircraft environment, embodiments of the invention are not so limited and have general application to electrical power systems in non-aircraft applications, such as other mobile applications and non-mobile industrial, commercial, and residential applications.

Figure 2:
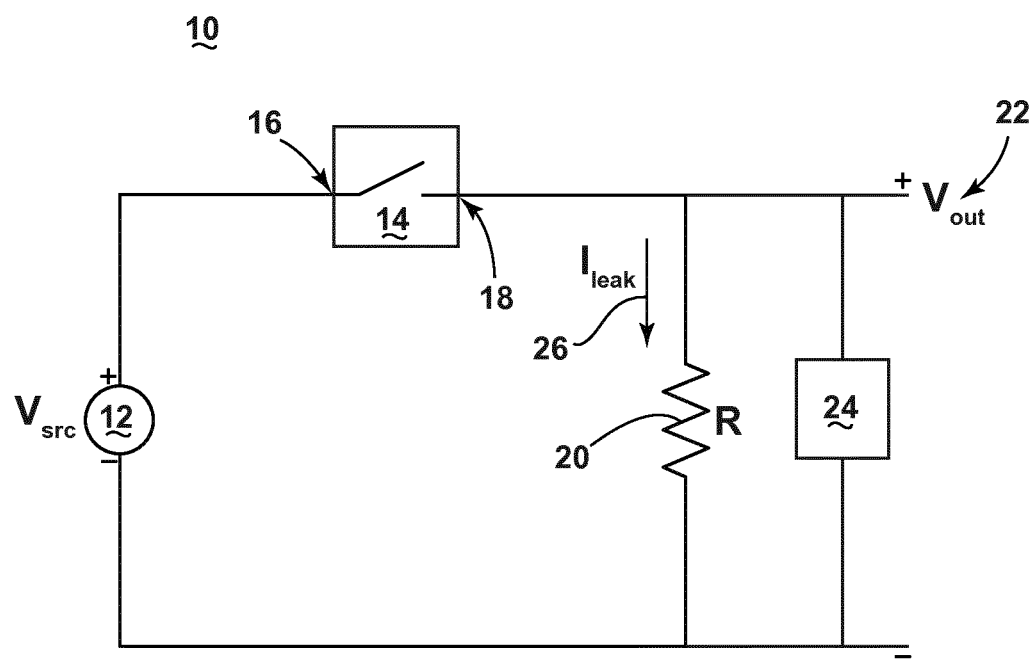
FIG. 2 is a prior art diagram of an electrical circuit having a leakage current path.

FIG. 2 illustrates a prior art leakage management circuit 10 for a power distribution system as shown, for example, in FIG. 1. The leakage management circuit 10 includes a voltage source 12, such as an alternating current (AC) voltage source, in series with a switching component 14 (hereafter, "switch") having a switch input 16 coupled with the voltage source 12 and a switch output 18 further coupled with a voltage output 22 and coupled with a leakage resistor 20. The leakage resistor 20 can be configured in parallel with the voltage output 22, which can, for example, be electrically coupled with one or more electrical loads, shown as a single load 24. In this example, the switch 14 controls the "on" and "off" operation of the circuit 10 or the load 24, but will supply a leakage current when the switch 14 is open. In this sense, the switch 14 can operate as a power distribution node by selectively enabling, disabling, or switching on or off the delivery of power from the voltage source 12 to the electrical load 24.

The circuit 10 is configured such that when the switch 14 is closed, current, conducts from the voltage source 12, through the switch 14, to the electrical load 24. While the switch 14 is closed, a portion of the current can also travel across the leakage resistor 20, however the leakage resistor 20 is selected such that a majority of the power in the circuit 10 is supplied to the electrical load 24. The circuit 10 is also configured such that when the switch 14 is open (as shown), the majority of any leakage current 26 still passing from the switch output 18, and thus the majority of the leakage power, will be dissipated across the resistor 20. In this sense, even though the electrical circuit 10 is "off," a small amount of leakage current 26 can still exist and must be accounted for in the circuit 10.

An undesirable effect of this configuration is that the resistor 20 conducts current when the switch 14 is closed (i.e. where there is no leakage current 26 to account for), and thus, undesirably dissipates an amount of power regardless of the presence of the leakage current 26. In a circuit 10 conducting a large amount of current when the switch 14 is closed, the resistor 20, consequently, can dissipate a large amount of power. To account for this otherwise wasted power dissipation, alternative prior art embodiments are known to include a second switch, controllable to enable or disable the leakage current 26 path, to correspond, respectively, with the switch 14 being open or closed. However, these prior art embodiments require an "awareness" or "knowledge" of the state of the switch 14, that is, if the switch is opened or closed. In this sense, such embodiments are actively controlled, based on the state of the switch 14.

Figure 3:
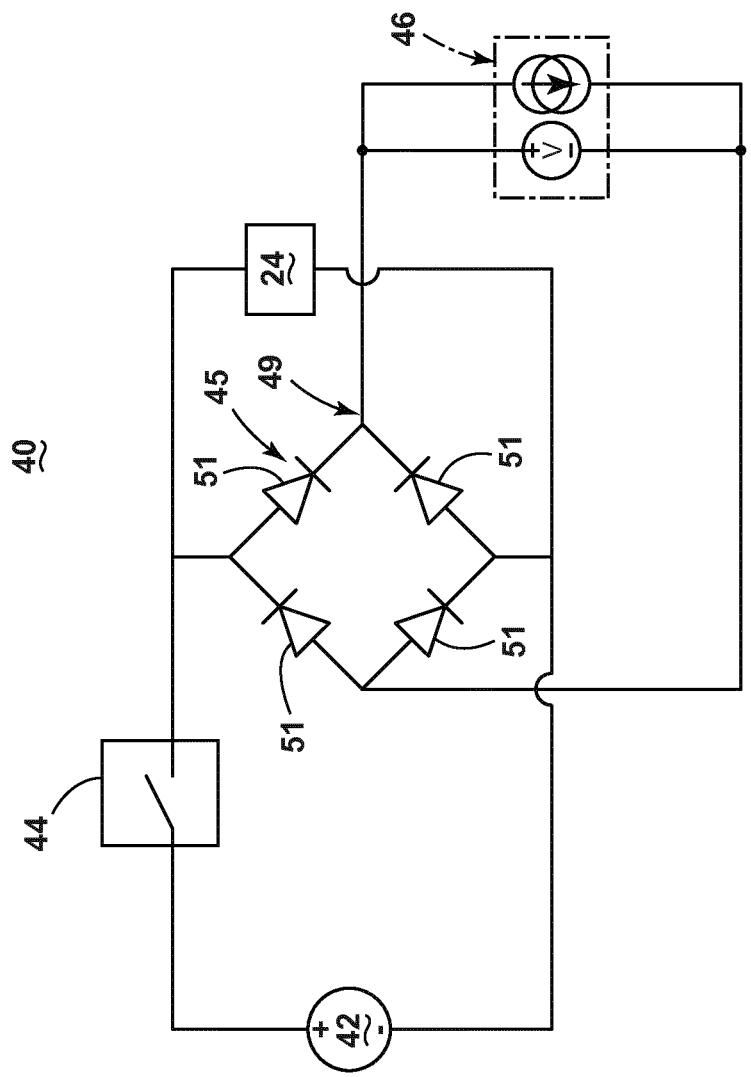
FIG. 3 is a diagram of a passive leakage management circuit.

FIG. 3 illustrates a passive leakage management circuit 40 according to embodiments of the invention. The leakage management circuit 40 includes a voltage source, for example, a 115 or 240 Volt at 400 Hertz AC voltage source 42 in series with a solid state switch 44, shown as an SSPC, and a rectifying module 45 having a rectifying module output 49. The rectifying module 45 can be configured in parallel with a voltage output, which can, for example, be electrically coupled with one or more electrical loads, shown as a single load 24. The leakage management circuit 40 further includes a non-linear voltage-controlled current sink (VCCS) 46 electrically coupled with the rectifying module output 49.

The rectifying module 45 is configured to rectify the AC power delivered by the AC voltage source 42, by way of the solid state switch 44, to a DC power at a rectifying module output 49. The rectifying module 45 can contain an arrangement of rectifying components 51, such as diodes, configured to rectify the AC power to DC power. In the example illustrated, a single phase of AC power, supplied by the AC voltage source 42 can be rectified by the full bridge configuration of the rectifying module 45 to supply a DC power output. The DC power is then supplied to the VCCS 46, wherein, for example, an amount of power can be dissipated by the VCCS 46. While a full bridge rectifying module 45 configuration is illustrated, half bridge rectifying modules 45, or alternative rectifying components 51 can be included.

One non-limiting example of the solid state switch 44 can include a silicon carbide (SiC) or Gallium Nitride (GaN) based, high power switch. SiC or GaN can be selected based on their solid state material construction, their ability to handle high voltages and large power levels in smaller and lighter form factors, and their high speed switching ability to perform electrical operations very quickly. Additional switching devices and additional silicon-based power switches can be included.

Figure 4:
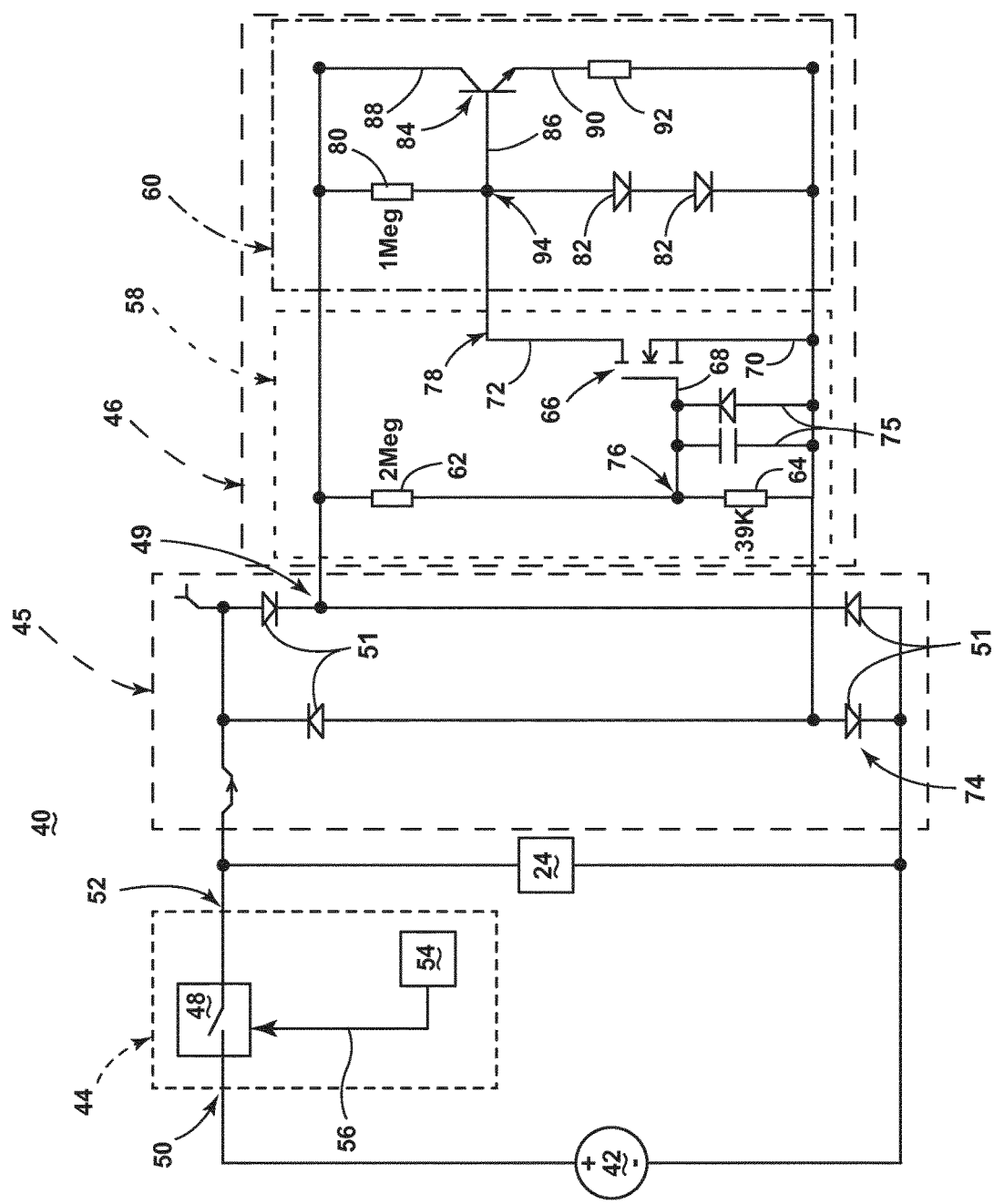
FIG. 4 is a detailed diagram of the passive leakage management circuit of FIG. 3

Turning now to FIG. 4, additional details of the passive leakage management circuit 40 are shown and described. The solid state switch 44 can further include a switching component 48 electrically coupled with the AC voltage source 42 via an solid state switch input 50, and the VCCS 46 via a solid state switch output 52. The switching component 48 is operable in a first operating mode, wherein the switching component 48 is closed and the solid state switch output 52 supplies an output current provided by the voltage source 42 to the solid state switch input 50 ("closed state"), and in a second operating mode, wherein the switching component 48 is open, yet the solid state switch output 52 supplies a leakage current from the solid state switch input 50 ("open state"). The solid state switch 44 can further include a controller 54 configured to provide a control signal 56 to the switching component 48 to operate the switch in the open and closed states.

The switching component 48 in the closed state is configured to supply a predetermined voltage from the voltage source 42, such as 115 VAC, to the electrical load 24. Due to the parallel electrical configuration, the predetermined voltage from the voltage source 42 is further supplied to the rectifying module 45, which is configured to rectify, by way of the one or more rectifying components 51, the solid state switch output 52 to the a DC voltage rectifying module output 49. The rectifying module output 49 is supplied to the VCCS 46. While the switching component 48 in the closed state is configured to supply the predetermined voltage from the voltage source 42, the switching component 48 in the open state will supply a leakage current having a leakage voltage, which is lower or less than the predetermined voltage. The leakage voltage is similarly supplied to the rectifying module 45, rectified by the one or more rectifying components 51, and supplied to the VCCS 46. One non-limiting example of a leakage voltage can include 25 VAC, which is rectified to a 25 VDC by the rectifying module 45.

The VCCS 46 can further include a voltage control circuit portion 58 and a current sink circuit portion 60, configured in parallel with one another. The voltage control circuit portion 58 can include, for example, a first resistor 62, shown as a 2 megaohm resistor, a second resistor 64, shown as a 39 kiloohm resistor, and a first transistor 66, such as a metal-oxide-semiconductor field-effect transistor (MOSFET) having a gate terminal 68, a source terminal 70, and a drain terminal 72. The first and second resistors 62, 64 are configured in series, running between the rectifying module output 49 and the rectifier return 74, with a first node 76 located between the resistors 62, 64 and electrically coupled with the gate terminal 68 of the first transistor 66. The drain terminal 72 of the first transistor 66 if further electrically coupled with a voltage control circuit output 78, and the source terminal 70 of the first transistor 66 is electrically coupled with the common ground 74.

The voltage control circuit portion 58 can optionally include one or more filtering components 75 or energy storage components, illustrated as a capacitor and a diode configured electrically in parallel with the second resistor 64 (i.e. between the first node 76 and the common ground 74). The filtering components 75 can be selected and configured to regulate, smooth, or filter a portion of the DC voltage supplied by the rectifying module output 49. The filtering components 75 can be further selected based on at least one of the AC output current or the AC leakage current. For example, rectification of an AC voltage can result in a DC voltage including a voltage "ripple," that is, a voltage output variation based on imperfect rectification of the rectifying module 45 or rectifying components 51. The filtering components 75 can be configured to regulate, smooth, reduce, eliminate, or filter out a portion of the DC voltage ripple to provide for a DC voltage having less variation. A DC voltage having less variation can be desirable for the configuration, operation, or predictability of the leakage management circuit 40.

The current sink circuit portion 60 of the VCCS 46 includes a third resistor 80, shown as a 1 megaohm resistor, at least one diode, shown as identical dual diodes 82, a second transistor 84, such as a bipolar transistor having a base terminal 86, collector terminal 88, and emitter terminal 90, and a current set or leakage resistor 92, which can include a 680 ohm resistor, for example. The third resistor 80 is configured in series with the each diode 82, running between the rectifying module output 49 and the rectifier return 74, with the diodes 82 forward facing toward the rectifier return 74. A second node 94 is located between the third resistor 80 and diodes 82, and electrically coupled with both the base terminal 86 of the second transistor 84 and the voltage control circuit output 78. The collector terminal 88 of the second transistor 84 is further coupled with the rectifying module output 49 and the emitter terminal 90 of the second transistor 84 is further coupled with the rectifier return 74, via the leakage resistor 92. While a leakage resistor 92 is described, the leakage resistor 92 can further include, for example, one or more shunt resistors, variable resistors, or zener diodes. Furthermore, while a 680 ohm resistor is described, additional leakage resistors 92, diodes, and the like can be included and, for example, can be selected based on a desired or expected leakage power to be dissipated, or configuration thereof, as explained below. For example, in one non-limiting example configuration, a selected leakage resistor 92 can include an active or passing cooling configuration, and thus, can dissipate a larger amount of leakage power.

The first and second resistors 62, 64 of the voltage control circuit portion 58 are selected to provide the first node 76 a voltage and current sufficient to operate the gate terminal 68 of the first transistor 66 during different solid state switch outputs 52. Additionally or alternatively, the first transistor 66 can be selected to operate in a particular configuration, such as selecting a first transistor 66 with a specific gate threshold voltage, to allow the source terminal 70 and drain terminal 72 to conduct current. Embodiments of the invention can include configurations of the first resistor 62, second resistor 64, or first transistor 66 such that when the solid state switch output 52 or rectifying module output 49 provides a current having the predetermined voltage indicating the switching component 48 is closed, the first node 76 will provide a voltage sufficient to enable, or "turn on" the first transistor 66, such that the first transistor 66 will conduct current between the source terminal 70 and the drain terminal 72, effectively providing a "low" voltage signal (e.g. zero volts) to the voltage control circuit output 78.

Additionally, the embodiments of the invention can include configurations of the first resistor 62, second resistor 64, or first transistor 66 such that when the solid state switch output 52 provides a leakage current having the leakage voltage indicating the switching component 48 is open, the first node 76 will provide a voltage insufficient to turn on the first transistor 66 (i.e. the first transistor 66 "turns off"), such that the first transistor 66 will not conduct current between the source terminal 70 and the drain terminal 72, effectively providing a "high" voltage signal (e.g. approximately 1.2 V) at the voltage control circuit output 78.

The current sink circuit portion 60 of the VCCS 46 operates such that the second transistor 84 is disabled, or "turns off" such that the second transistor 84 does not conduct current between the collector terminal 88 and the emitter terminal 90, in response to a "low" voltage signal on the base terminal 86, which, is electrically coupled with the voltage control circuit output 78. Conversely, the current sink circuit portion 60 of the VCCS 46 operates such that the second transistor 84 is enabled, or "turns on" such that the second transistor 84 conducts current between the collector terminal 88 and the emitter terminal 90, in response to a "high" voltage signal on the base terminal 86. The third resistor 80 or second transistor 84 can be selected, in combination with the diodes 82 or the first transistor 66, to provide a sufficient on/off operation based on the threshold voltage of the second transistor 84 or the expected voltages at the second node.

Thus, the leakage management circuit 40 operates in two distinct modes. In a first closed mode, having a closed switching component 48 such that the solid state switch output 52 supplies the output current provided to the solid state switch input 50, having a predetermined voltage, such as 115 VAC to power or operate the electrical load 24. During this closed mode, the rectifying module 45 operates to rectify the AC solid state switch output 52 to a DC rectifying module output 49, and provide the output 49 to the VCCS 46. The selection or configuration of the voltage control circuit portion 58, first resistor 62, second resistor 64, or first transistor 66 turns on the first transistor 66, such that it provides a "low" voltage signal, via the voltage control circuit output 78, to the base terminal 86 of the current sink circuit portion 60. The current sink circuit portion 60 of the VCCS 46, in response to the "low" voltage signal from the voltage control circuit output 78, turns off the second transistor 84. This operation, in turn, defines a first current path originating from the solid state switch output 52 and traversing, at least, through the third resistor 80, the second node 94, and between the source terminal 70 and drain terminal 72 of the first transistor 66, to the rectifier return 74.

The leakage management circuit 40 further operates in a second leakage mode, having an open switching component 48 such that the AC solid state switch output 52 supplies a leakage current having a maximum leakage AC voltage, such as 25 VAC, where the leakage voltage is determined by ohm's law by multiplying leakage current through leakage resistor 92 with the resistance of leakage resistor 92, as explained below. While 25 VAC is given as a non-limiting example, it is understood that the selection of the leakage resistor 92 is not a parameter of the leakage itself, but is determined by the resistor 92 selected to affect a controlled leakage current amount.

During this leakage mode, the rectifying module 45 operates to rectify the AC solid state switch output 52 to a DC rectifying module output 49, and provide the output 49 to the VCCS 46. The selection or configuration of the voltage control circuit portion 58, first resistor 62, second resistor 64, or first transistor 66 turns off the first transistor 66, such that it provides a "high" voltage signal, via the voltage control circuit output 78, to the third terminal 94 of the current sink circuit portion 60. The current sink circuit portion 60 of the VCCS 46, in response to the "high" voltage signal from the voltage control circuit output 78, turns on the second transistor 84. This operation, in turn, defines a leakage current path originating from the solid state switch output 52, through the rectifying module 45, and traversing between the collector terminal 88 and emitter terminal 90 of the second transistor 84, through the leakage resistor 92, to the rectifier return 74. Embodiments of the invention can enable only one of the first current path or leakage current path at any given moment.

In this sense, the leakage management circuit 40 conducts current along the first current path based on the solid state switch output 52, and the circuit 40 conducts current along the leakage current path based on the first transistor 66 conducting current. The leakage management circuit 40 is, thus, passive, or unmanaged, and will operate based on the solid state switch output 52 alone, independent or without awareness of the state of the switching component 48.

Consequently, the third resistor 80 can be selected to provide a low power dissipation along the first current path when the solid state switch output 52 is powering the electrical load 24, and the leakage resistor 92 can be selected to provide a different low power dissipation along the leakage current path when the solid state switch output 52 provides the leakage current. The leakage resistor 92 can further be selected to provide a given leakage voltage for a given leakage current amount, while the switching component 48 is open.

Many other possible embodiments and configurations in addition to that shown in the above figures are contemplated by the present disclosure. For example, while the first transistor 66 is shown as a MOSFET and the second transistor 84 is shown as a bipolar transistor, it will be evident to one skilled in the art that these devices can be interchangeable with alternative transistor types or configurations to provide controlled operation in response to selected circuit operates. Furthermore, while examples, for instance, the first transistor 66 or second transistor 84 generating "low" or "high" voltage signals, and correspondingly, "on" or "off" operations, it will be evident to one skilled in the art that alternative transistor or circuit configurations can invert the high/low or on/off operations, yet provide for substantially similar leakage management circuit 40 operations. Additionally, embodiments of the invention can include transistors that cannot necessarily operate in strict "on" or "off" modes of operation, and can operate according to one or more non-linear modes of operation. In these embodiments, the non-linear modes of operation can generate transitional electrical characteristics on the circuit 40 until they settle into a steady-state mode of operation, which can be considered the "on" or "off" mode of operation, as described above.

In yet another embodiment of the invention, the leakage current can be caused by components other than just the switching component 48. For example, input or output voltage monitors, in or about the solid state switch 44 can contribute to an overall leakage current. Additional source of leakage current can be included. In yet another embodiment of the invention, leakage current dissipation can be further improved by providing a second, or more, redundant leakage current circuits 40 to avoid possible component failures in the VCCS 46. While a set of various components is described herein, it will be understood that "a set" can include any number of the respectively described elements, including only one element. Additionally, the design and placement of the various components can be rearranged such that a number of different in-line configurations could be realized.

The embodiments disclosed herein provide a leakage management circuit for a leaky switch by enabling a leakage current path independent to, or without awareness of, the state of the switch. One advantage that can be realized in the above-described embodiments is that the above described embodiments provide for a leakage current path for dissipating leakage power, reducing the likelihood that hazardous voltages or unmanaged current will have unintended consequences on the electrical circuit, including creating shorts, voltage spikes, thermal consequences such as fire, or shocking hazards. Furthermore, by including redundant leakage management circuits, the likelihood of unintended consequences if further reduced in the scenario of component failure. Reducing the likelihood of unintended consequences increases the overall safety of the electrical system.

Another advantage that can be realized in the above-described embodiments is that the enabling of the different current paths provides a leakage management circuit that avoids unnecessary power dissipation by providing a first current path for low power dissipation while the switch is closed, and a leakage current path for low power dissipation while the switch is opened. Low power dissipation result in less wasted power in the electrical circuit.

Yet another advantage that can be realized in the above-described embodiments is that the leakage management circuit operates effectively without needing awareness or knowledge of the state of the switch in order to maintain the leakage management functionality. This eliminates the need for monitoring the state of the switch for leakage management, and can further eliminate the need for any additional controllers, second switches, and additional power or circuit requirements associated with state-based leakage management circuits. Reduced components result in improved reliability of the overall leakage management circuit.

To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A passive leakage management circuit for a switch leakage current comprising:
   a switch that includes an input electrically coupled with a source of alternating current (AC) and an output electrically coupled with an electrical load, and is operable in a first operating mode, wherein the output supplies an AC output current provided to the input and having a first AC voltage, and in a second operating mode, wherein the output supplies an AC leakage current from the input and having a second AC voltage lower than the first AC voltage;
   a rectifying module electrically coupled with the switch output and that rectifies the AC output current to a direct current (DC) output current during the first operating mode and the second operating mode;
   a first current path that receives the DC output current and includes a first transistor that conducts current along the first current path based on the switch output; and
   a leakage current path that receives the DC output current and includes a second transistor that conducts current along the leakage current path based on the first transistor not conducting current;
   wherein at least one of the first current path or leakage current path conducts current based on the switch output, without an additional power source beyond the switch output, and independent of the first or second operating mode of the switch, and wherein only one of the first current path or leakage current path conducts current when the switch is coupled with the source of alternating current.

2. The passive leakage management circuit of claim 1, wherein the leakage current path further comprises a first resistor selected to dissipate a first amount of power when the leakage current path conducts current.

3. The passive leakage management circuit of claim 2, wherein the first current path further comprises a second resistor selected to dissipate a second amount of power when the first current path conducts current.

4. The passive leakage management circuit of claim 3, wherein the first amount of power is less than that second amount of power.

5. The passive leakage management circuit of claim 2, wherein the first resistor further comprises a resistor selected to dissipate the leakage current.

6. The passive leakage management circuit of claim 5, wherein the first resistor comprises at least one of a shunt resistor, a variable resistor, or a zener diode.

7. The passive leakage management circuit of claim 1, wherein the switch comprises a solid state power controller (SSPC).

8. The passive leakage management circuit of claim 1, wherein at least one of the first current path or leakage current path conducts current based on the switch output, without awareness of the operating mode of the switch.

9. The passive leakage management circuit of claim 1, wherein the rectifying module includes a full bridge configuration.

10. The passive leakage management circuit of claim 1, further comprising at least one of a filtering component or an energy storage component positioned downstream from the rectifying module configured to reduce a rectified current ripple.

11. The passive leakage management circuit of claim 10, wherein the at least one of the filtering component or the energy storage component is selected based on at least one of the AC output current or the AC leakage current.

12. A power management circuit comprising:
    a switch having an input receiving AC power, an AC output, and a switching component selectively coupling the input with the AC output between an open switching state and a closed switching state;
    a rectifier configured to rectify the AC output of the switch to a DC output; and
    a continuous voltage-controlled current sink configured to receive the DC output, and defining a first current path for dissipating a first amount of power when the switching state is closed and a leakage current path for dissipating a second amount of power when the switching state is open;
    wherein the continuous voltage-controlled current sink continuously conducts the DC output along one of the first current path or the leakage current path regardless of the switching state, and without an additional power source beyond the DC output, and wherein only one of the first current path or leakage current path conducts current when the switch is coupled with the input receiving AC power.

13. The power management circuit of claim 12, wherein the leakage current path further comprises a first resistor selected to dissipate a first amount of power when the leakage current path conducts current.

14. The power management circuit of claim 13, wherein the first current path further comprises a second resistor selected to dissipate a second amount of power when the first current path conducts current.

15. The power management circuit of claim 14, wherein the first amount of power is less than that second amount of power.

16. A leakage management circuit comprising:
    a rectifier configured to rectify an AC input to a DC output; and
    a voltage-controlled current sink configured to receive the DC output, and defining a first current path for dissipating a first amount of power when the AC input satisfies a first profile and a leakage current path for dissipating a second amount of power when the AC input satisfies a second profile;

wherein the voltage-controlled current sink conducts the DC output along only one of the first current path or the leakage current path automatically when the switch is coupled with the AC input and regardless of the AC input, without an additional power source beyond the AC input.

17. The leakage management circuit of claim 16, wherein the leakage current path further comprises a first resistor selected to dissipate a first amount of power when the leakage current path conducts current.

18. The leakage management circuit of claim 17, wherein the first current path further comprises a second resistor selected to dissipate a second amount of power when the first current path conducts current.

19. The leakage management circuit of claim 18, wherein the first amount of power is less than that second amount of power.

20. The leakage management circuit of claim 16, further comprising at least one of a filtering component or an energy storage component positioned downstream from the rectifier and configured to reduce a rectified current ripple.

21. The leakage management circuit of claim 16, wherein the leakage current path conducts current without a delay.

22. The leakage management circuit of claim 16, wherein the voltage-controlled current sink conducts the DC output along one of the first current path or the leakage current path automatically and without delay, regardless of the AC input.

* * * * *